United States Patent [19]
Schutten et al.

[11] Patent Number: 6,121,779
[45] Date of Patent: Sep. 19, 2000

[54] BULK CURRENT INJECTION SYSTEM

[75] Inventors: Michael Joseph Schutten, Rotterdam; William George Earls, Schenectady, both of N.Y.

[73] Assignee: General Electric Company, Schenectady, N.Y.

[21] Appl. No.: 09/134,800

[22] Filed: Aug. 14, 1998

[51] Int. Cl.$^7$ .................................................. G01R 27/28
[52] U.S. Cl. .......................................... 324/627; 324/102
[58] Field of Search ............................... 324/627, 72, 95, 324/96, 102, 628, 529

[56] References Cited

U.S. PATENT DOCUMENTS

| | | | |
|---|---|---|---|
| Re. 35,644 | 10/1997 | Rogers | 324/72 |
| 4,074,188 | 2/1978 | Boatman et al. | 324/52 |
| 4,142,143 | 2/1979 | Daniel | 324/51 |
| 4,335,348 | 6/1982 | Reed et al. | 324/51 |
| 4,438,389 | 3/1984 | De Sa | 324/52 |
| 4,517,511 | 5/1985 | Suto | 324/52 |
| 4,546,309 | 10/1985 | Kang et al. | 324/52 |
| 4,884,034 | 11/1989 | Guzman | 324/529 |
| 5,541,521 | 7/1996 | North et al. | 324/628 |
| 5,574,378 | 11/1996 | Meyer et al. | 324/541 |
| 5,689,192 | 11/1997 | Gogers | 324/627 |

OTHER PUBLICATIONS

"Development of a system level bench teest for the automotive industry" p. 270–275, 1990.

"Development of a System Level Bench Test for the Automotive Industry," PH Lever; Seventh International Conference on Electromagnetic Compatability, 1990, pp. 270–275. No month available.

"The Application of Bulk Current Injection in Susceptibility Testing of Automotive Electronics," Wolfgang Bittinger, Regional Symposium on Electromagnetic Compatibility, Nov. 1992, 4.1.2, pp. 1–6.

*Primary Examiner*—Safet Metjahic
*Assistant Examiner*—Vincent Q. Nguyen
*Attorney, Agent, or Firm*—Jill M. Breedlove; Douglas E. Stoner

[57] ABSTRACT

A bulk current injection (BCI) system and method for testing electromagnetic susceptibility of electrical apparatus includes an RF modulator in a BCI setup. The BCI setup with RF modulator injects high instantaneous currents with a very low, controllable duty cycle into a wire under test, thereby simulating an electromagnetic environment to which electrical equipment is exposed during an electrical transient event. The RF modulator provides an amplitude modulated envelope for removing undesirable transients. Injecting currents at selectable frequency, one frequency at a time, allows for frequency-amplitude electromagnetic susceptibility mapping for each major wire within an electrical apparatus.

10 Claims, 3 Drawing Sheets

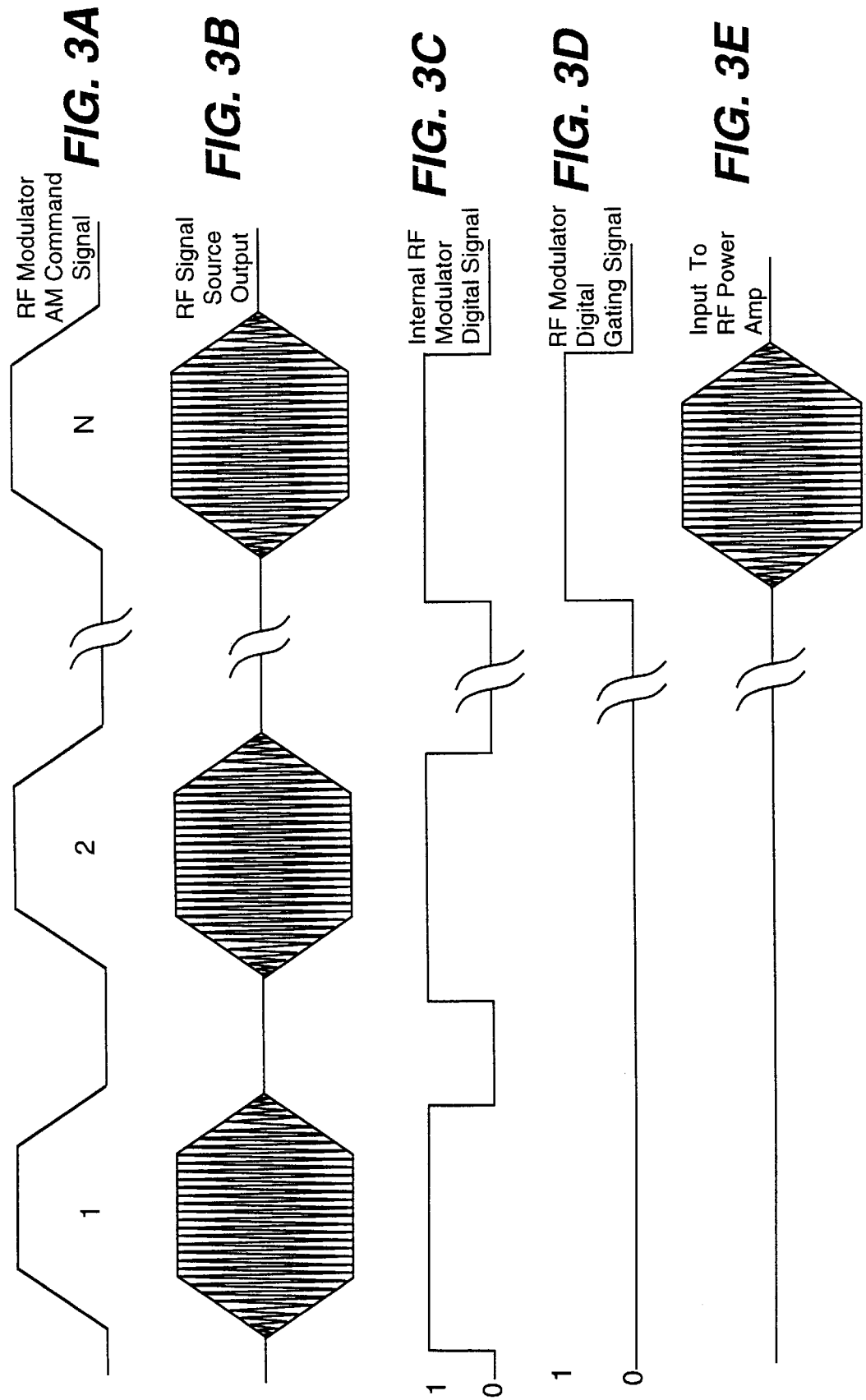

BULK CURRENT INJECTION SYSTEM

BACKGROUND OF THE INVENTION

This invention relates to bulk current injection techniques for electromagnetic susceptibility testing.

Bulk current injection (BCI) techniques are widely used for equipment susceptibility testing in the automotive and aerospace industries. BCI involves injecting high-frequency electrical currents (e.g., 1 MHz–1 GHz) into wires connected to the equipment under test. A useful and properly designed BCI test setup provides valuable information on equipment susceptibility to induced high-frequency currents. High-frequency "noise" can be caused by many electrical events, such as, for example, high-voltage electrical ignition modules, relay coil and contact opening or closing, nearby lightning storms, and other transient electrical events.

Conventional BCI approaches inject a continuous high, radio frequency (RF) current into a wire under test. The induced current level required to create an electromagnetic susceptibility problem is often so large that the injected RF energy destroys the equipment under test. It is desirable to induce large currents for electromagnetic susceptibility testing, but with a sufficiently low effective duty cycle so that no permanent damage occurs to the equipment under test. Such a low-effective-duty-cycle injected waveform should induce no other currents than at the intended single injection frequency.

SUMMARY OF THE INVENTION

A bulk current injection (BCI) system and method for testing electromagnetic susceptibility of electrical apparatus comprises an RF modulator in a BCI setup. The BCI setup with RF modulator injects high instantaneous currents with a very low, controllable duty cycle into a wire under test, thereby simulating an electromagnetic environment to which electrical equipment is exposed during an electrical transient event. The RF modulator provides an amplitude modulated (AM) envelope for removing undesirable transients. Injecting currents at selectable frequencies, one frequency at a time, allows for frequency-amplitude electromagnetic susceptibility mapping for each major wire within an electrical apparatus.

BRIEF DESCRIPTION OF THE DRAWINGS

FIGS. 3A–3E graphically illustrates RF signals generated in the BCI system of FIG. 1.

DETAILED DESCRIPTION OF THE INVENTION

Figure 1:
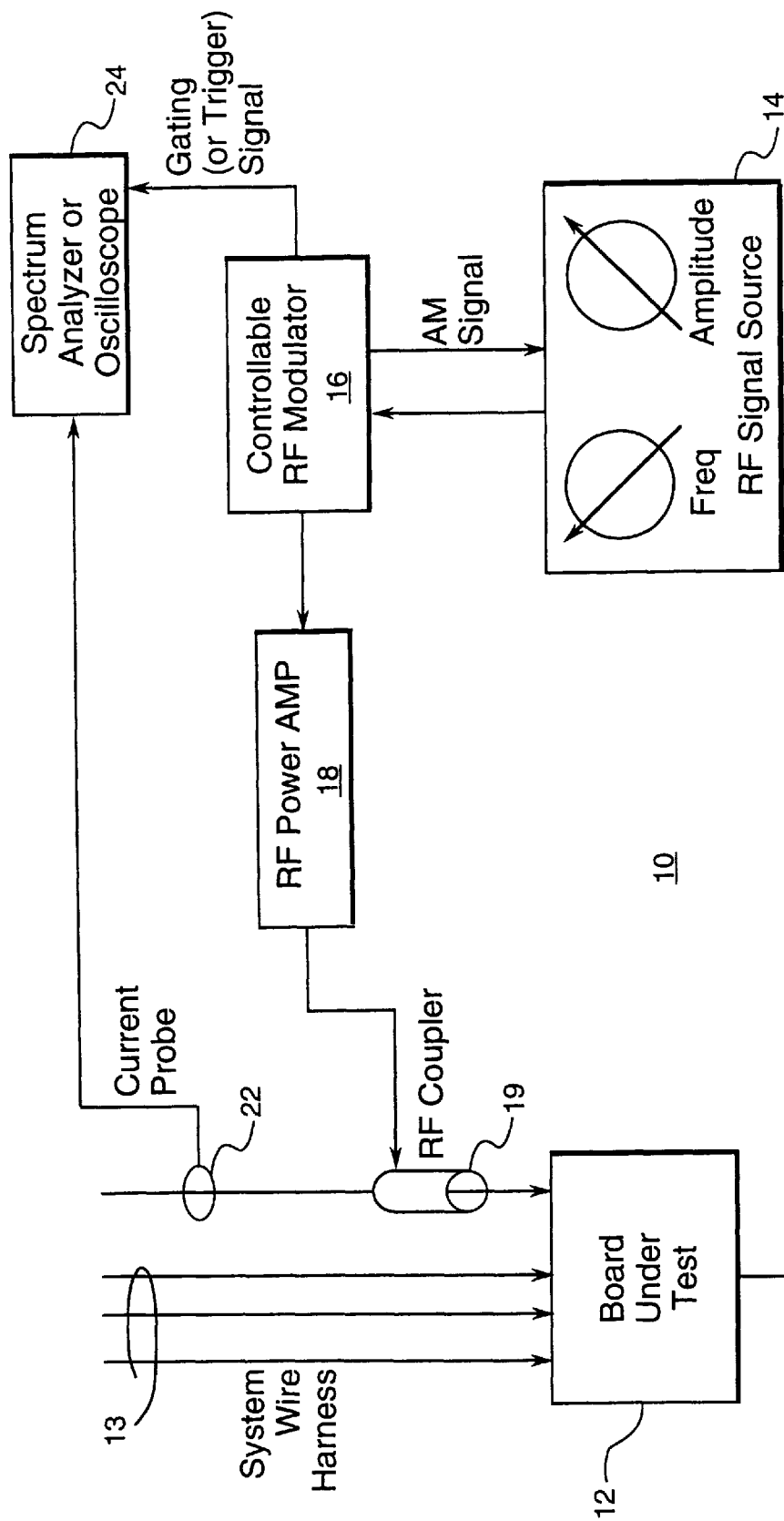
FIG. 1 is a block diagram illustrating a BCI system in accordance with preferred embodiments of the present invention.

FIG. 1 illustrates a BCI system 10 for testing electrical apparatus represented as a Board Under Test 12 having a wiring harness 13. BCI system 10 includes an RF signal source 14 which applies an RF signal to a controllable RF modulator 16 which, in turn, provides an output signal to an RF power amplifier 18. The RF power amplifier is coupled to the board under test 12 through an RF injection coupler 19. A current probe 22 measures the induced current and is connected to a device such as a spectrum analyzer or oscilloscope 24 for monitoring induced current level in the electrical apparatus being tested. A gating, or trigger, signal is applied to analyzer 24, as shown, from the RF modulator.

In operation, RF modulator 16 ensures that the average energy injected into the electrical apparatus being tested is small, even though the instantaneous energy can be large. RF signal source 14 applies an amplitude modulated (AM), single-frequency RF sinusoidal signal to the controllable RF modulator 16. The RF modulator provides the AM control signal to the RF signal source. The RF modulator 16 output is a selectable, low-effective-duty-cycle, AM signal which contains the high-frequency, sinusoidal frequency from RF signal source 14. Another output of RF modulator 16 is a digital gating signal which is a logic level one when the AM signal is non-zero. The RF modulator can be controlled to provide a duty cycle which is controllable from 100% to less than 0.05%.

Figure 2:
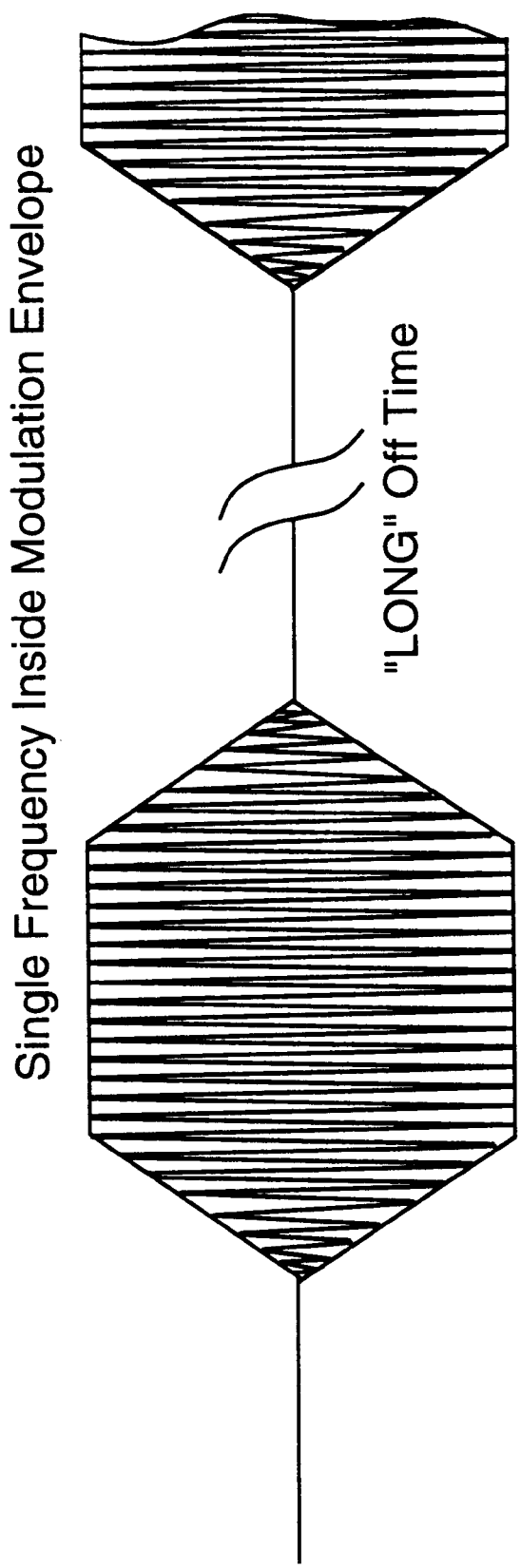
FIG. 2 graphically illustrates an exemplary output signal from the RF modulator of FIG. 1.

The output of RF modulator 16 is applied to RF power amplifier 18. In turn, the signal from the RF power amplifier, via RF coupler 19, induces a current into a wire in the equipment under test (e.g., wiring harness 13). FIG. 2 illustrates an exemplary current waveform for the current injected into the board under test. The wavy lines in FIG. 2 denote a relatively long period of time during which the signal remains at zero volts. Current probe 22 (FIG. 1) measures the magnitude of the induced, modulated, low-duty-cycle, single-frequency signal. The trigger gating signal from the RF modulator allows appropriate gating of the oscilloscope or spectrum analyzer during the time for which the high-frequency currents are injected into the wiring harness of the board under test. In addition, the gating signal from the RF modulator provides information as to when the currents are being injected into the wire under test.

The magnitude of the induced current can be increased until the susceptibility failure limit is determined. The high-frequency RF signal amplitude is increased as appropriate, and the process is repeated until currents at all appropriate frequencies have been injected. The entire process is then repeated for all appropriate wires connected to the electrical equipment being tested. The result is a frequency-magnitude mapping of the susceptibility level of the equipment under test FIGS. 3A–3E graphically illustrate RF signals generated in the BCI system of FIG. 1. The wavy lines in FIG. 3 denote a relatively long period of time during which the appropriate signal is repeated. In particular, FIG. 3A illustrates the results of RF modulator settings which independently adjust amplitude, duty cycle, rise time, and fall time for an external AM command signal. (The provision of settings for such a signal implementation is well-known to those of ordinary skill in the art of signal generation.) FIG. 3A illustrates this signal as an exemplary AM (command) signal from RF modulator 16 to RF signal source AM input 14. FIG. 3B illustrates the AM, RF signal source output. FIG. 3C shows the internal RF modulation digital signal with a repetitive pattern of digital signals. This digital signal is a logic level one when the RF signal source is non-zero, and a logic level zero when the RF signal source is at zero volts. This pattern is continually repeated; N such modulation envelopes are shown. The internal digital signal is divided by N to provide a gating (or trigger) signal, as shown in FIG. 3D. The digital gating signal in the RF modulator is also the digital command to an RF switch (not shown). The RF switch input is the RF signal source output (FIG. 3B). The output of the RF switch is the RF signal source output when the gating signal is a logic level one; otherwise, it is zero. The RF switch output signal shown in FIG. 3E is the input to the RF amplifier. The value of N is a controllable setting on the RF modulator. This gating signal (FIG. 3D) is also provided externally to trigger the oscilloscope (or spectrum analyzer) when the RF amplifier is putting out the intentional signal. The output signal which is applied to RF power amplifier 18 is illustrated in FIG. 3E.

Advantageously, a BCI system according to preferred embodiments of the present invention induces high instantaneous currents, but low average currents. This allows the susceptibility limit of the equipment under test to be determined without inducing a level of energy which might otherwise destroy the equipment.

With the amplitude and frequency of the induced current being separately adjustable, the susceptibility amplitude for each induced frequency may be determined for every wire in the equipment under test. The locations and frequencies of induced failures comprise valuable information on weaknesses and potential improvements for the equipment under test.

The amplitude modulated envelope has separately controllable rise and fall times. This advantageously eliminates transient effects from any other than the desired single injected frequency. Such a transient could occur if the rise or fall time of the amplitude modulated envelope were very fast, e.g., a square wave modulation envelope.

In exemplary applications for the BCI system of FIG. 1, an AM envelope has an "on-time" of 500 microseconds, a rise time of 100 microseconds, and a fall time of 100 microseconds. A typical duty cycle is 0.5% or 0.05%, and the frequency within the AM envelope (i.e., the inducing frequency) is typically between 1 MHz and 1 GHz. The inducing frequency and amplitude can be independently controlled from the RF signal generator.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A bulk current injection (BCI) system for determining electromagnetic susceptibility of electrical apparatus under test, comprising:

an RF signal source for providing RF current signals at predetermined injection frequencies, each signal being provided one frequency at a time;

a controllable RF modulator for receiving the RF current signals from the RF signal source and providing an amplitude modulated signal containing the single-frequency signal from the RF signal source at a predetermined duty cycle;

an RF power amplifier for injecting the amplitude modulated signal from the RF modulator via RF coupling means into the electrical apparatus under test;

a current probe for measuring the magnitude of current induced into the electrical apparatus under test as a result of injecting the amplitude modulated RF signal.

2. The BCI system of claim 1 wherein the RF modulator comprises means for generating a digital gating signal for triggering external devices when the RF modulator has a non-zero output signal.

3. The BCI system of claim 1 wherein the RF modulator includes adjustment means for adjusting the amplitude modulated signal.

4. The BCI system of claim 3 wherein the adjustment means adjusts the duty cycle in a range from less than 0.05% to 100%.

5. A method for determining electromagnetic susceptibility of electrical apparatus under test, comprising:

providing RF current signals at predetermined injection frequencies, each signal being provided one frequency at a time;

modulating each respective RF current signal and providing an amplitude modulated signal at a predetermined duty cycle;

injecting each respective amplitude modulated signal as an induced current into the electrical apparatus under test;

measuring the magnitude of current induced into the electrical apparatus under test as a result of injecting each respective amplitude modulated signal into the electrical apparatus under test.

6. The method of claim 5, further comprising the step of triggering an external device when the result of the modulating step is a non-zero output signal.

7. The method of claim 5, further comprising the step of adjusting the duty cycle of the modulated signal.

8. The method of claim 7 wherein the adjusting step comprises adjusting the duty cycle in a range from less than 0.05% to 100%.

9. A bulk current injection (BCI) system for determining electromagnetic susceptibility of electrical apparatus under test, comprising:

an RF signal source for providing RF current signals at predetermined injection frequencies, each signal being provided one frequency at a time;

a controllable RF modulator for receiving the RF current signals from the RF signal source and providing an amplitude modulated signal containing the single-frequency signal from the RF signal source at a controllable duty cycle to the electrical apparatus under test so as to simulate an electromagnetic environment during an electrical transient event; and a current probe for measuring the magnitude of current induced into the electrical apparatus under test as a result of injecting the amplitude modulated RF signal.

10. A method for determining electromagnetic susceptibility of electrical apparatus under test, comprising:

providing RF current signals at predetermined injection frequencies, each signal being provided one frequency at a time;

modulating each respective RF current signal and providing an amplitude modulated signal at a controllable duty cycle, the amplitude modulated signal having an adjustable envelope;

injecting each respective amplitude modulated signal as an induced current into the electrical apparatus under test;

measuring the magnitude of current induced into the electrical apparatus under test as a result of injecting each respective amplitude modulated signal into the electrical apparatus under test; and mapping frequency-amplitude susceptibility for selected wires within the electrical apparatus under test based on the measured induced currents.

\* \* \* \* \*